United States Patent
Tan

(10) Patent No.: US 11,233,138 B2
(45) Date of Patent: Jan. 25, 2022

(54) THIN FILM TRANSISTOR AND METHOD OF MANUFACTURING SAME

(71) Applicant: SHENZHEN CHINA STAR OPTOELECTRONICS TECHNOLOGY CO., LTD., Guangdong (CN)

(72) Inventor: Zhiwei Tan, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 278 days.

(21) Appl. No.: 16/495,157

(22) PCT Filed: May 27, 2019

(86) PCT No.: PCT/CN2019/088513
§ 371 (c)(1),
(2) Date: Sep. 18, 2019

(87) PCT Pub. No.: WO2020/224013
PCT Pub. Date: Nov. 12, 2020

(65) Prior Publication Data
US 2021/0336028 A1    Oct. 28, 2021

(30) Foreign Application Priority Data
May 9, 2019   (CN) .................. 201910383608.X

(51) Int. Cl.
*H01L 29/66*    (2006.01)
*H01L 29/786*   (2006.01)

(52) U.S. Cl.
CPC .... *H01L 29/6675* (2013.01); *H01L 29/78663* (2013.01)

(58) Field of Classification Search
CPC .......... H01L 29/6675; H01L 29/66765; H01L 29/78663; H01L 29/78669
See application file for complete search history.

(56) References Cited

U.S. PATENT DOCUMENTS

2012/0086013 A1   4/2012  Lee
2013/0260568 A1  10/2013  Hwang
(Continued)

FOREIGN PATENT DOCUMENTS

CN    102148259 A    8/2011
CN    104617152 A    5/2015
(Continued)

*Primary Examiner* — Syed I Gheyas

(57) ABSTRACT

A thin film transistor (TFT) and a method of manufacturing same are provided. A photoresist layer is dry-etched to form a tunnel before an active layer is formed, wherein a bottom of the tunnel is a copper trace layer. After that, two edges of the photoresist layer are aligned with two edges of the copper trace layer. Therefore, the photoresist layer won't protrude over an amorphous silicon layer to block the etching gas from etching the amorphous silicon layer. As a result, an aperture ratio of the TFT is increased, and quality of the TFT is improved. By forming an oxidation protective layer on the tunnel, the copper trace layer is prevented from being reacted with the etching gas to form a compound. Therefore, metals or compounds on the tunnel can be completely etched, and quality of the TFT is further improved.

8 Claims, 9 Drawing Sheets

(56) References Cited

U.S. PATENT DOCUMENTS

2016/0343863 A1 11/2016 Chi
2017/0243891 A1* 8/2017 Seo ..................... H01L 29/7869
2020/0135767 A1* 4/2020 Ge ..................... H01L 21/0262

FOREIGN PATENT DOCUMENTS

CN 108807421 A 11/2018
KR 20130010774 A 1/2013

* cited by examiner

THIN FILM TRANSISTOR AND METHOD OF MANUFACTURING SAME

FIELD OF INVENTION

The present invention relates a field of display technology and, more particularly, to a thin film transistor and a method of manufacturing same.

BACKGROUND OF INVENTION

With development of display technology, people's demand for liquid crystal displays (LCDs) and organic light-emitting diodes (OLEDs) becomes higher and higher. Display panels play a vital role in the LCDs and the OLEDs. For example, the LCDs generally include a thin film transistor (TFT), a color filter (CF), and a liquid crystal layer between the TFT and the CF. By applying a voltage to a TFT substrate and a CF substrate to change a direction of liquid crystals, light emitted from the backlight module can be refracted by the liquid crystals to generate an image.

A conventional TFT substrate generally includes a gate layer, an insulating layer, an active layer, a source/drain layer, and a pixel electrode layer. Drying etching method is used in a process of manufacturing the active layer of the conventional TFT substrate, wherein material of the active layer is amorphous silicon. As shown in FIG. 1, a photoresist layer 20 protrudes over an amorphous silicon layer 21. Therefore, the photoresist layer 20 blocks an etching gas from etching the amorphous silicon layer 21 during a dry-etching process, which leads to the outward-protruding silicon layer 21 after the dry-etching process. As a result, parasitic capacitances may appear at the outward-protruding silicon layer 21, which will badly affect performance of the TFT.

SUMMARY OF INVENTION

To solve the above problem, the present invention provides a thin film transistor (TFT) and a method of manufacturing same. In the present invention, a photoresist layer is etched before a dry-etching process of an amorphous silicon layer to reduce a whole thickness and a protruding distance of the photoresist layer. Therefore, the amorphous silicon layer won't be blocked by the photoresist layer during the dry-etching process, thereby preventing parasitic capacitances from appearing, and quality of the TFT is improved.

Specific method is described as follows:

The present invention provides a method of manufacturing a TFT comprising steps of: disposing a gate layer, an insulating layer, an amorphous silicon layer, a metal layer, a copper trace layer, and a photoresist layer on a substrate; etching the copper trace layer and the metal layer outside a first region by a first wet-etching process; etching the photoresist layer to form a tunnel by a first dry-etching process, wherein a bottom of the tunnel is the copper trace layer; forming an oxidation protective layer in the tunnel; etching the amorphous silicon layer to form an active layer by a second dry-etching process; etching the copper trace layer and the metal layer in the tunnel to form a source electrode and a drain electrode by a second wet-etching process.

Material of the metal layer is Mo, MoTi, MoTa, MoNb, or MoW.

A method of forming the oxidation protective layer includes: oxidizing a surface of the copper trace layer in the tunnel by plasma oxidation.

A method of forming the oxidation protective layer includes: heating the copper trace layer in the tunnel to at least 200 degrees Celsius, and then cooling the copper trace layer in the tunnel with compressed air.

A left edge of the photoresist layer is aligned with a left edge of the copper trace layer after the first dry-etching process.

An etchant used in the first wet-etching process includes an acid etchant for etching copper.

An etchant used in the second wet-etching process includes an acid etchant for etching copper.

An etching gas used in the second dry-etching process includes $O_2$, $Cl_2$, and one or more of $NF_3$, $SF_6$, $CHF_3$, and $CF_4$.

To solve the above problem, the present invention further provides a TFT comprising: a substrate, a gate electrode disposed on the substrate, an insulating layer disposed on the gate electrode, an active disposed on the insulating layer, a source electrode and a drain electrode disposed on the active layer, wherein a tunnel is defined between the source electrode and the drain electrode.

A bottom of the tunnel is the active layer without remaining any other metals or metal compounds.

One edge of the active layer is aligned with an outer edge of the source electrode.

One edge of the active layer is aligned with an outer edge of the drain electrode.

Regarding the beneficial effects of the present invention: a TFT and a method of manufacturing same are provided. A photoresist layer is dry-etched to form a tunnel before an active layer is formed, wherein a bottom of the tunnel is a copper trace layer. After that, a left edge of the photoresist layer is aligned with a left edge of the copper trace layer, and a right edge of the photoresist layer is aligned with a right edge of the copper trace layer. Therefore, the photoresist layer won't protrude over an amorphous silicon layer to block the etching gas from etching the amorphous silicon layer during the second dry-etching process, thereby preventing parasitic capacitances from appearing. As a result, an aperture ratio of the TFT is increased, and quality of the TFT is improved. The present invention further forms an oxidation protective layer on the tunnel, which can prevent the copper trace layer from being reacted with the etching gas of the first dry-etching process to form a compound. By this process, a bottom of the tunnel can be formed without remaining any another metals or metal compounds after the process of forming a source/drain layer, and quality of the TFT is further improved.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
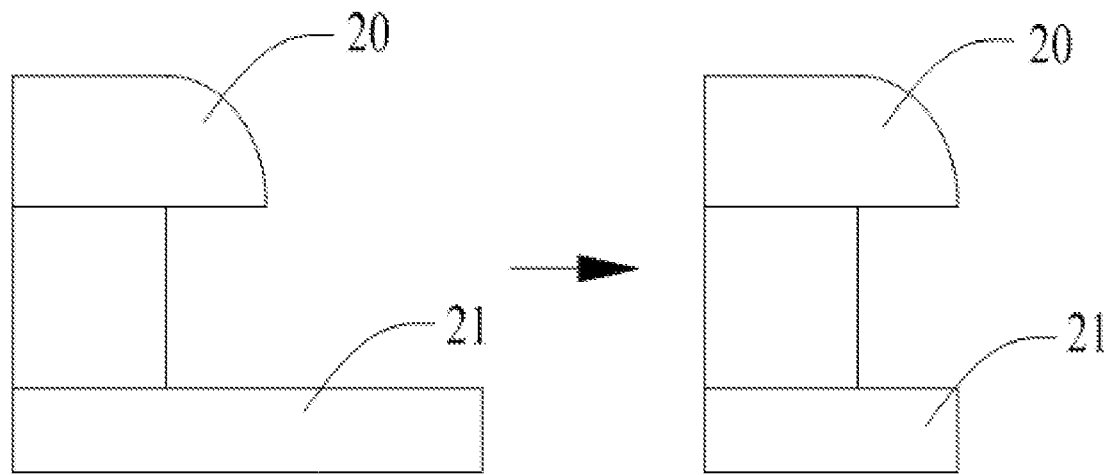
FIG. 1 is a schematic structural diagram showing a thin film transistor (TFT) during the process of forming an active layer in the prior art.

In order to further explain the technical means and effects of the present invention, the following detailed description will be made in conjunction with the preferred embodiments of the present invention and the accompanying drawings. In the following embodiments, the same portions are denoted by the same reference numerals in the different drawings.

In the prior art, during the process of forming an active layer, an amorphous silicon layer can't be completely etched due to a protruding photoresist layer, thereby causing parasitic capacitances to appear. A thin film transistor and a method of manufacturing same provided by the present invention can solve the above technical problem.

Figure 2:
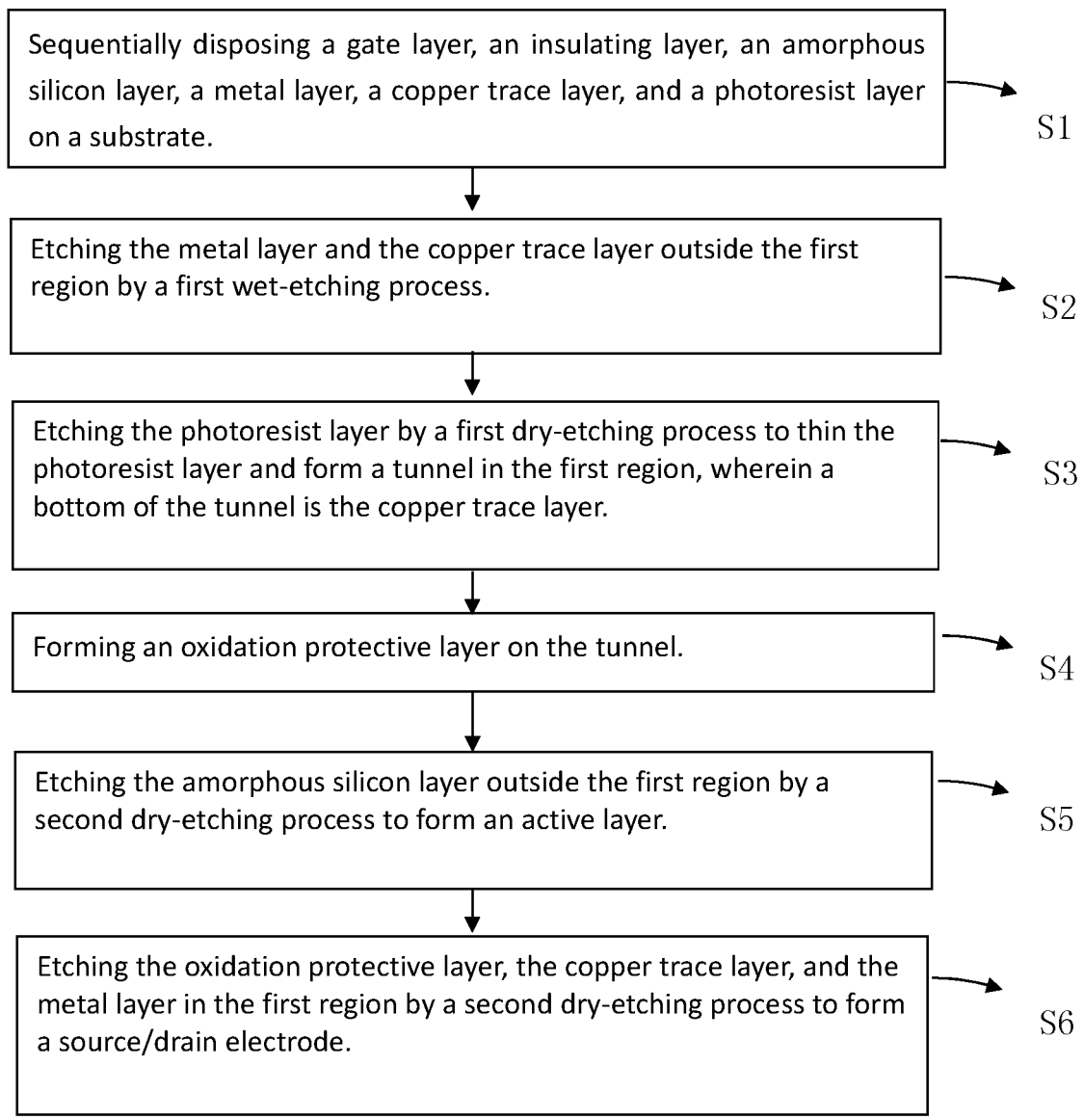
FIG. 2 is a flowchart showing a method of manufacturing a TFT according to an embodiment of the present invention.
Figure 3:
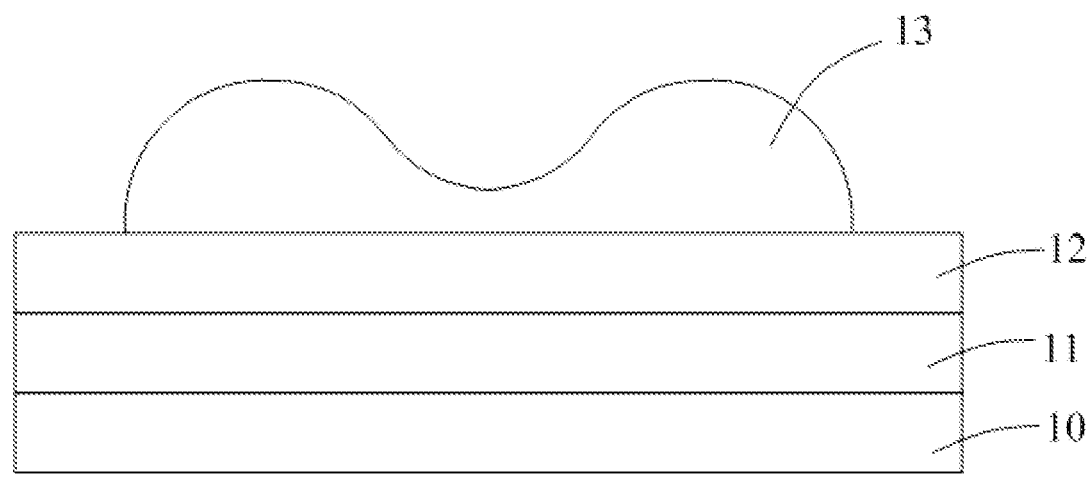
FIG. 3 is a schematic structural diagram showing a TFT after step 1 of the method of manufacturing a TFT according to an embodiment of the present invention.

FIG. 2 is a flowchart showing a method of manufacturing a TFT, comprising:

Step 1: referring to FIG. 3, sequentially disposing a gate layer (not shown), an insulating layer (not shown), an amorphous silicon layer 10, a metal layer 11, a copper trace layer 12, and a photoresist layer 13 on a substrate (not shown) sequentially.

Figure 4:
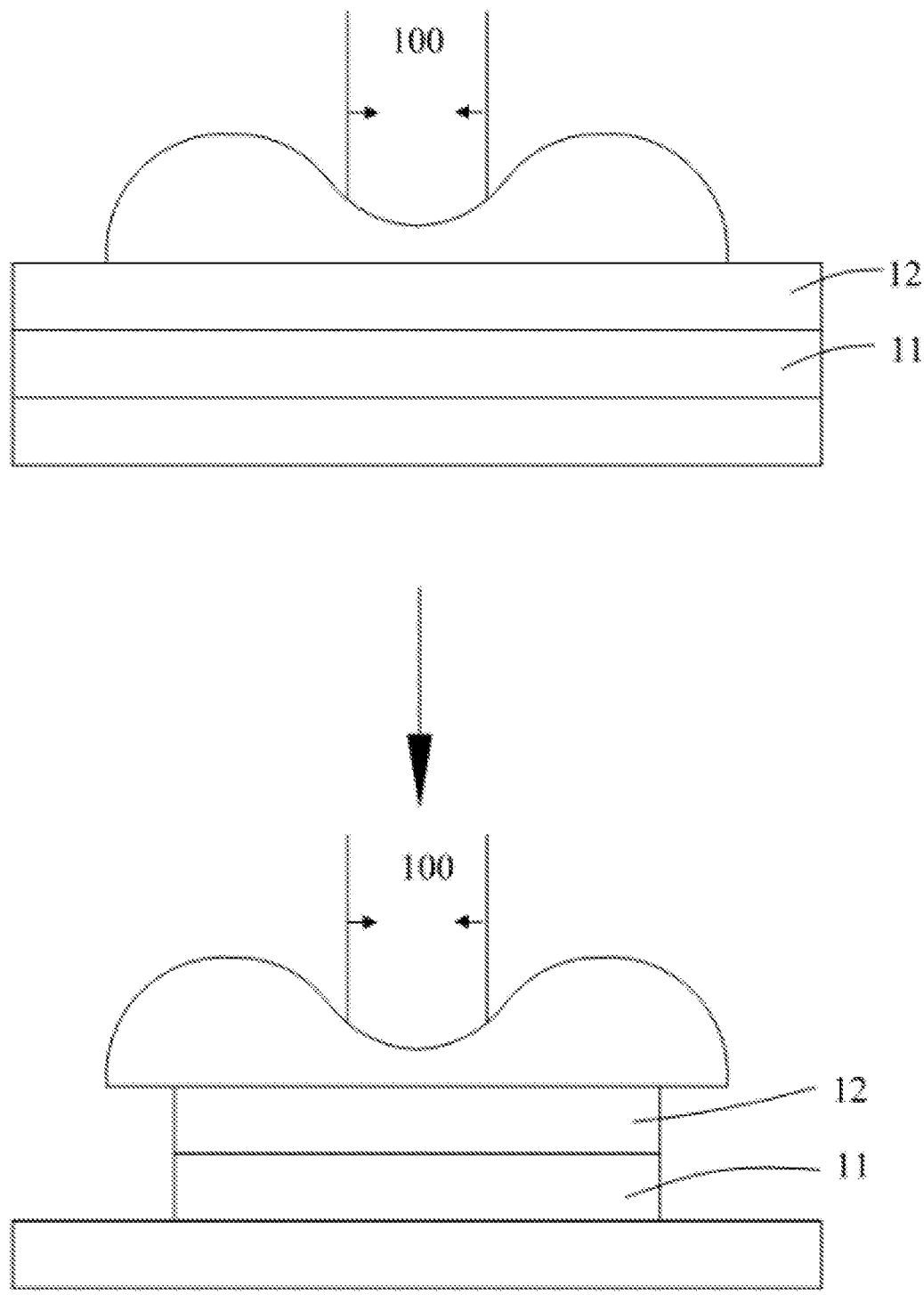
FIG. 4 is a schematic structural diagram showing a TFT after step 2 of the method of manufacturing a TFT according to an embodiment of the present invention.

Step 2: referring to FIG. 4, etching the metal layer 11 and the copper trace layer 12 outside the first region 100 by a first wet-etching process.

Figure 5:
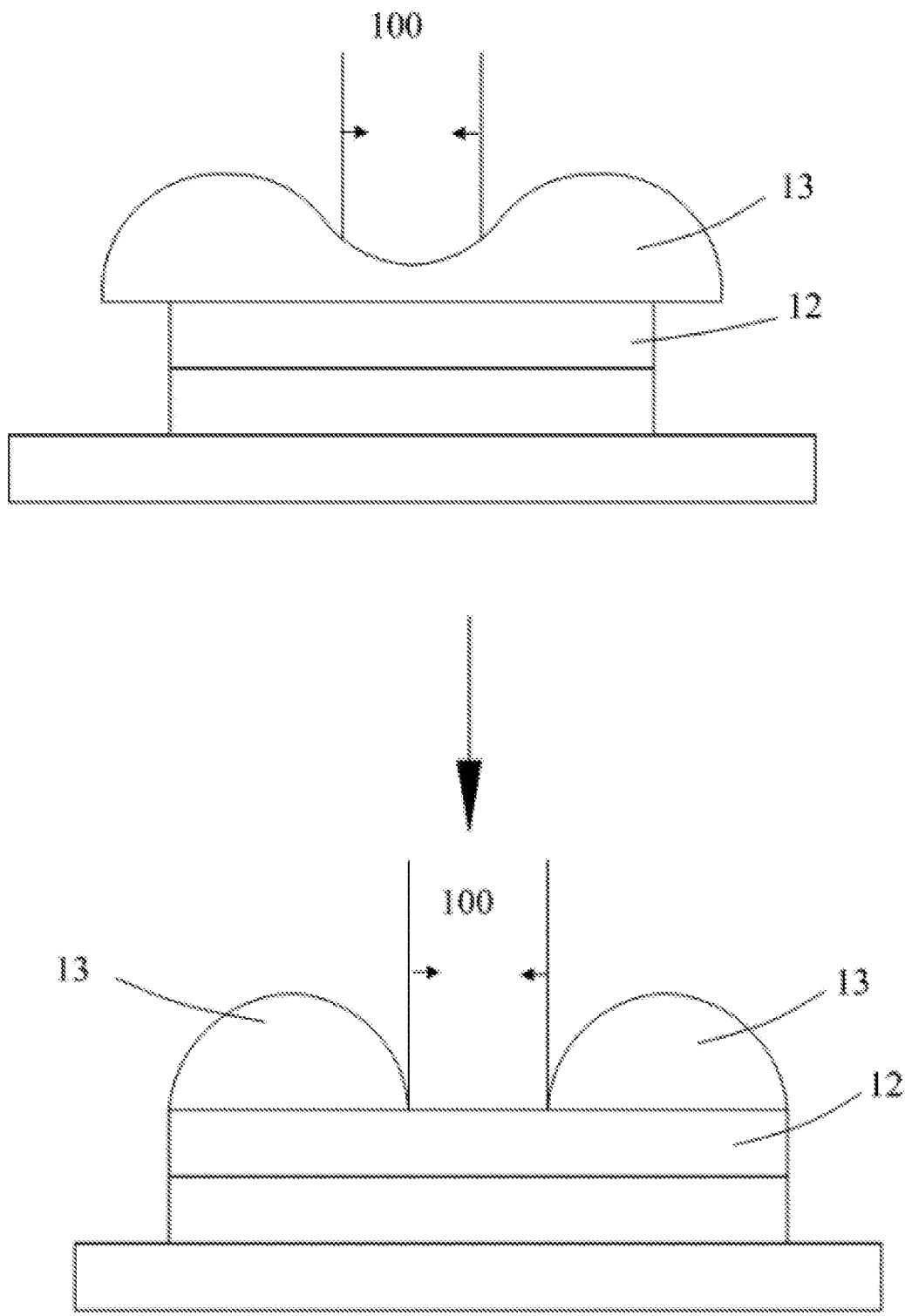
FIG. 5 is a schematic structural diagram showing a TFT after step 3 of the method of manufacturing a TFT according to an embodiment of the present invention.

Step 3: referring to FIG. 5, etching the photoresist layer 13 by a first dry-etching process to thin the photoresist layer 13, form a tunnel in the first region 100, make a left edge of the photoresist layer 13 align with a left edge of the copper trace layer 12, and make a right edge of the photoresist layer 13 align with a right edge of the copper trace layer 12, wherein a bottom of the tunnel is the copper trace layer 12.

Figure 6:
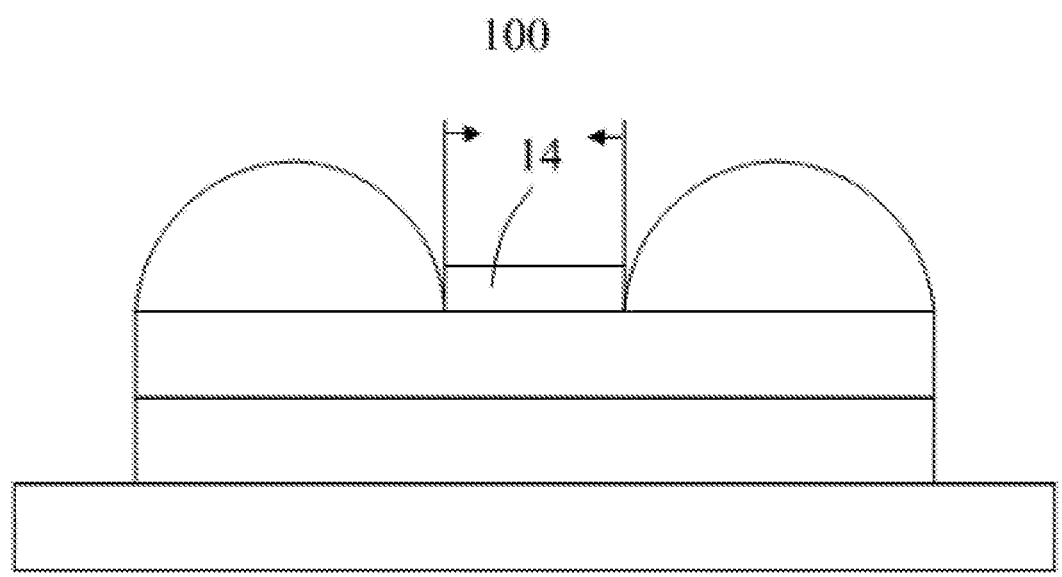
FIG. 6 is a schematic structural diagram showing a TFT after step 4 of the method of manufacturing a TFT according to an embodiment of the present invention.

Step 4: referring to FIG. 6, forming an oxidation protective layer 14 on the tunnel.

Figure 7:
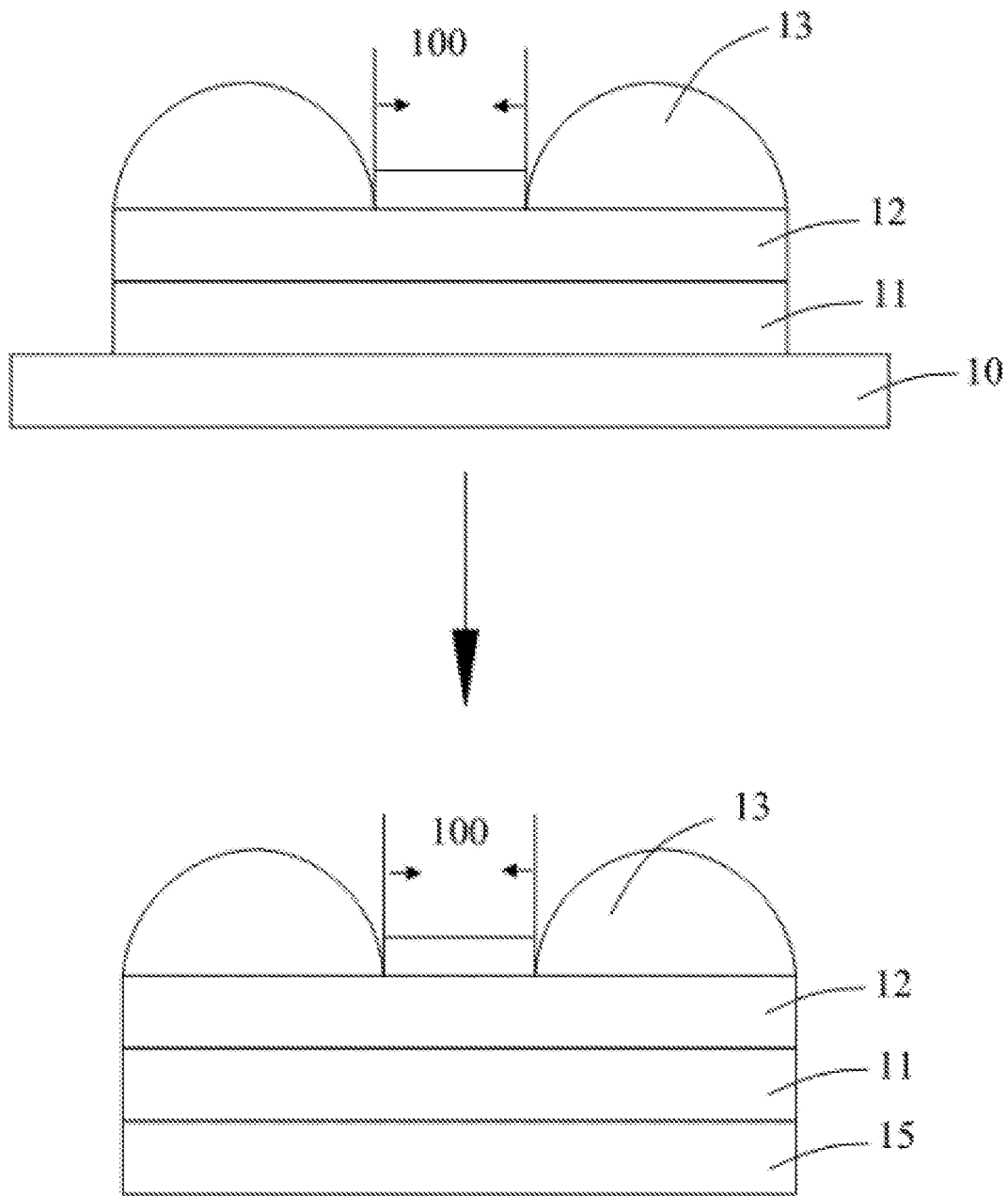
FIG. 7 is a schematic structural diagram showing a TFT after step 5 of the method of manufacturing a TFT according to an embodiment of the present invention.

Step 5: referring to FIG. 7, etching the amorphous silicon layer 10 outside the first region 100 by a second dry-etching process to form an active layer 15. Since two edges of the photoresist layer 13 are aligned with two edges of the copper trace layer 12, the photoresist layer 13 won't block an etching gas from etching the amorphous silicon layer 10. Therefore, two edges of the active layer 15 will also be aligned with two edges of the metal layer 11, thereby preventing parasitic capacitances from appearing. As a result, an aperture ratio of the TFT is increased, and quality of the TFT is improved.

Figure 8:
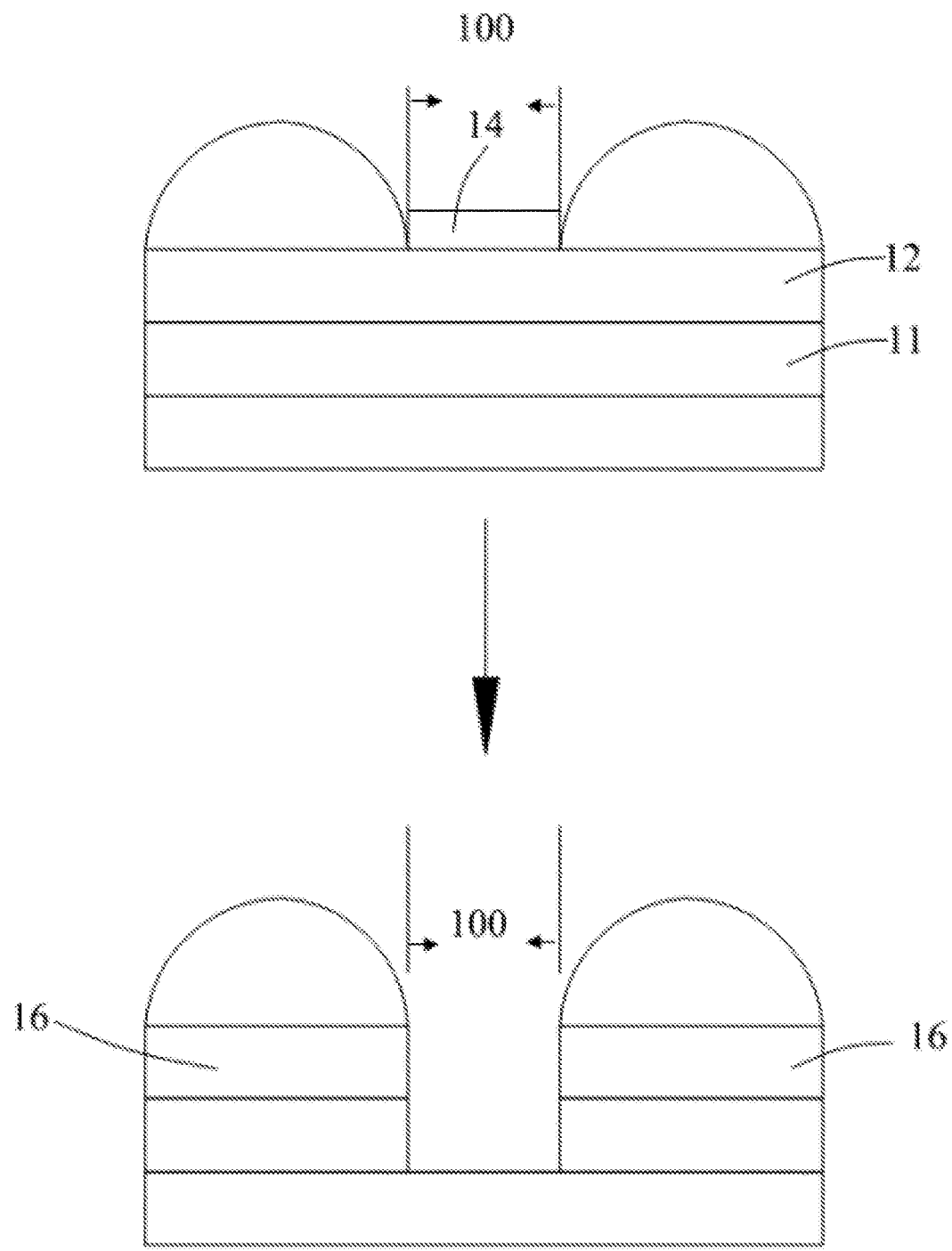
FIG. 8 is a schematic structural diagram showing a TFT after step 6 of the method of manufacturing a TFT according to an embodiment of the present invention.

Step 6: referring to FIG. 8, etching the oxidation protective layer 14, the copper trace layer 12, and the metal layer 11 in the first region 100 by a second wet-etching process to form a source/drain electrode 16. Since the oxidation protective layer 14 blocks the copper trace layer 12 from being reacted with an etching gas of the second dry-etching process, no compound is formed on the copper trace layer 12 in the first region 100. Therefore, the tunnel can be formed without remaining any other metals or metal compounds after the second wet-etching process, thereby improving quality of the TFT.

Specifically, material of the metal layer 11 is Mo.

Specifically, a method of forming the oxidation protective layer 14 of the tunnel includes: oxidizing a surface of the copper trace layer 12 in the tunnel by plasma oxidation.

Specifically, a right edge of the photoresist layer 14 is aligned with a right edge of the copper trace layer 12 after the step 3, and a left edge of the photoresist layer 14 is also aligned with a left edge of the copper trace layer 12 after the step 3.

Specifically, an etchant used in the first wet-etching process includes an acid etchant for etching copper.

Specifically, an etchant used in the second wet-etching process includes an acid etchant for etching copper.

Specifically, an etching gas used in the second dry-etching process includes $O_2$, $Cl_2$, and one or more of $NF_3$, $SF_6$, $CHF_3$, and $CF_4$.

Figure 9:
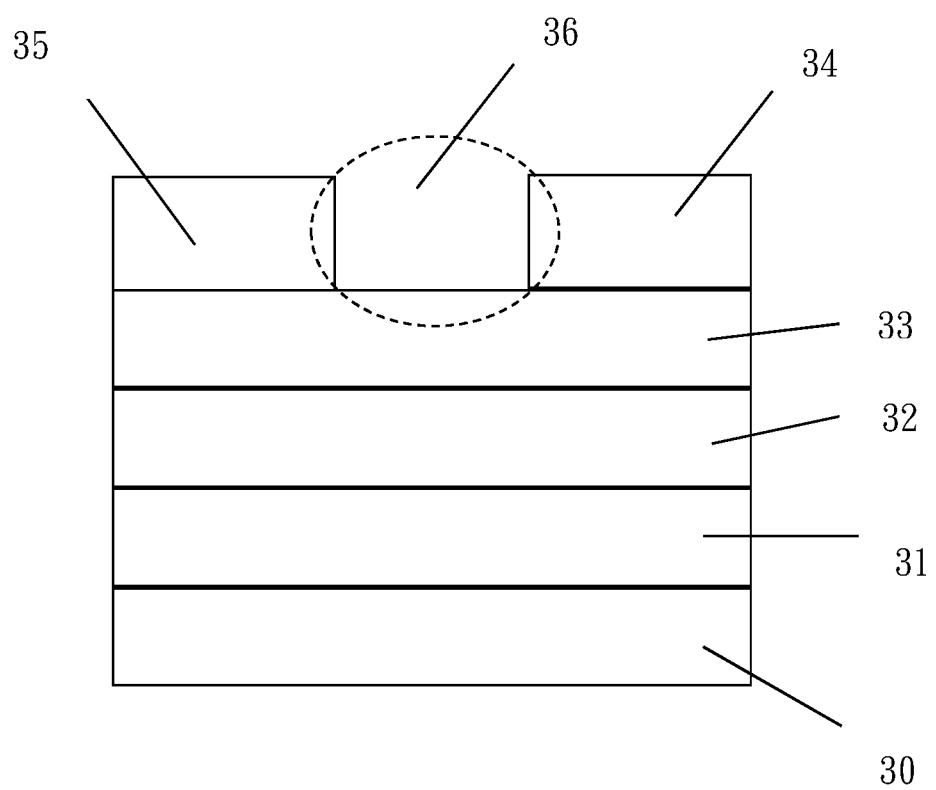
FIG. 9 is a schematic structural diagram showing a TFT according to an embodiment of the present invention.

Referring to FIG. 9, the present invention further provides a TFT comprising: a substrate 30, a gate layer 31 disposed on the substrate 30, an insulating layer 32 disposed on the gate layer 31, an active layer 33 disposed on the insulating layer 32, and a source electrode 34 and a drain electrode 35 disposed on the active layer 33, wherein a tunnel 36 is defined between the source electrode 34 and the drain electrode 35.

Specifically, a bottom of the tunnel 36 is the active layer 33 without remaining any other metals or metal compounds.

Specifically, one edge of the active layer 33 is aligned with an outer edge of the source electrode 34, and the other edge of the active layer 33 is aligned with an outer edge of the drain electrode 35.

Regarding the beneficial effect of the present embodiment: a TFT provided by the present embodiment has a tunnel between a source electrode and a drain electrode, wherein a surface of the tunnel is formed without remaining any metals or metal compounds. Quality of the TFT is improved. On the other hand, two edges of an active layer are respectively aligned with an outer edge of the source electrode and an outer edge of the drain electrode. Therefore, the amount of parasitic capacitance formed at the edge of the active layer is reduced, and quality of the TFT is further improved.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A method of manufacturing a thin film transistor (TFT), comprising steps of:

step 1: disposing a gate layer, an insulating layer, an amorphous silicon layer, a metal layer, a copper trace layer, and a photoresist layer on a substrate;

step 2: etching the copper trace layer and the metal layer outside a first region by wet etching;

step 3: etching the photoresist layer to form a tunnel by dry etching, and forming an oxidation protective layer in the tunnel, wherein a bottom of the tunnel is the copper trace layer;

step 4: etching the amorphous silicon layer by dry-etching to form an active layer;

step 5: etching the copper trace layer and the metal layer in the tunnel by wet-etching to form a source electrode and a drain electrode.

2. The method of claim 1, where material of the metal layer in step 1 is Mo, MoTi, MoTa, MoNb, or MoW.

3. The method of claim 1, wherein an etchant used in step 2 comprises an acid etchant for etching copper.

4. The method of claim 1, wherein an etchant used in step 5 comprises an acid etchant for etching copper.

5. The method of claim 1, wherein a right edge of the photoresist layer is aligned with a right edge of the copper trace layer after the step 3; and wherein a left edge of the photoresist layer is aligned with a left edge of the copper trace layer after the step 3.

6. The method of claim 1, wherein an etching gas used in the step 4 comprises $O_2$, $Cl_2$, and one or more of $NF_3$, $SF_6$, $CHF_3$, and $CF_4$.

7. The method of claim 1, wherein a method of forming the oxidation protective layer comprises:

oxidizing a surface of the copper trace layer in the tunnel by plasma oxidation.

8. The method of claim 1, wherein a method of forming the oxidation protective layer comprises:

heating the copper trace layer in the tunnel to at least 200 degrees Celsius; and cooling the copper trace layer in the tunnel with compressed air.

* * * * *